(12) United States Patent
Nagae et al.

(10) Patent No.: US 6,525,838 B1
(45) Date of Patent: Feb. 25, 2003

(54) COLOR IMAGE PROCESSING APPARATUS AND RECORDING MEDIUM

(75) Inventors: Takeshi Nagae, Kawasaki (JP); Hiroki Ino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/438,384

(22) Filed: Nov. 12, 1999

(30) Foreign Application Priority Data

Feb. 26, 1999 (JP) .......................................... 11-050964

(51) Int. Cl.$^7$ .......................... H04N 1/40; B41B 15/00; G03F 3/08
(52) U.S. Cl. ...................... 358/3.01; 358/534; 358/535; 358/521
(58) Field of Search ........................ 358/1.1, 1.9, 3.01, 358/518, 519, 534, 535, 520, 521; 399/39; 355/77

(56) References Cited

U.S. PATENT DOCUMENTS

| | | | | |
|---|---|---|---|---|
| 4,657,831 A | * | 4/1987 | Ambro et al. ................. | 430/14 |
| 4,708,459 A | * | 11/1987 | Cowan et al. ................. | 355/40 |
| 5,014,086 A | * | 5/1991 | Barry .......................... | 355/71 |
| 6,026,216 A | * | 6/2000 | Ohtsuka et al. ............... | 358/1.9 |
| 6,241,339 B1 | * | 6/2001 | Kondo ......................... | 347/43 |
| 2002/0008880 A1 | * | 1/2002 | Dewitte et al. .............. | 358/1.9 |

FOREIGN PATENT DOCUMENTS

| | | |
|---|---|---|
| JP | 7-78824 | 8/1995 |
| JP | 7-222005 | 8/1995 |
| JP | 10-191078 | 7/1998 |

* cited by examiner

Primary Examiner—Kimberly A. Williams
(74) Attorney, Agent, or Firm—Staas & Halsey LLP

(57) ABSTRACT

An object is to provide a print proof that takes account of halftone dots and operating conditions of a printing press. To achieve the object, a color image processing apparatus for producing the print proof comprises: a dot gain processing unit for receiving an input of halftoned binary image data, and for converting the binary image data to multi-value image data corresponding to the amount of dot gain of each color; a first color-converting unit for converting the multi-value image data to image data in a device-independent color space; a resolution converting unit for changing the resolution of the multi-value image in the device-independent color space to match the resolution of an output device; and a second color-converting unit for converting the multi-value image data, converted into the device-independent color space, to image data in a color space associated with the output device.

18 Claims, 22 Drawing Sheets

BEFORE DOT GAIN
PROCESSING

AFTER DOT GAIN
PROCESSING

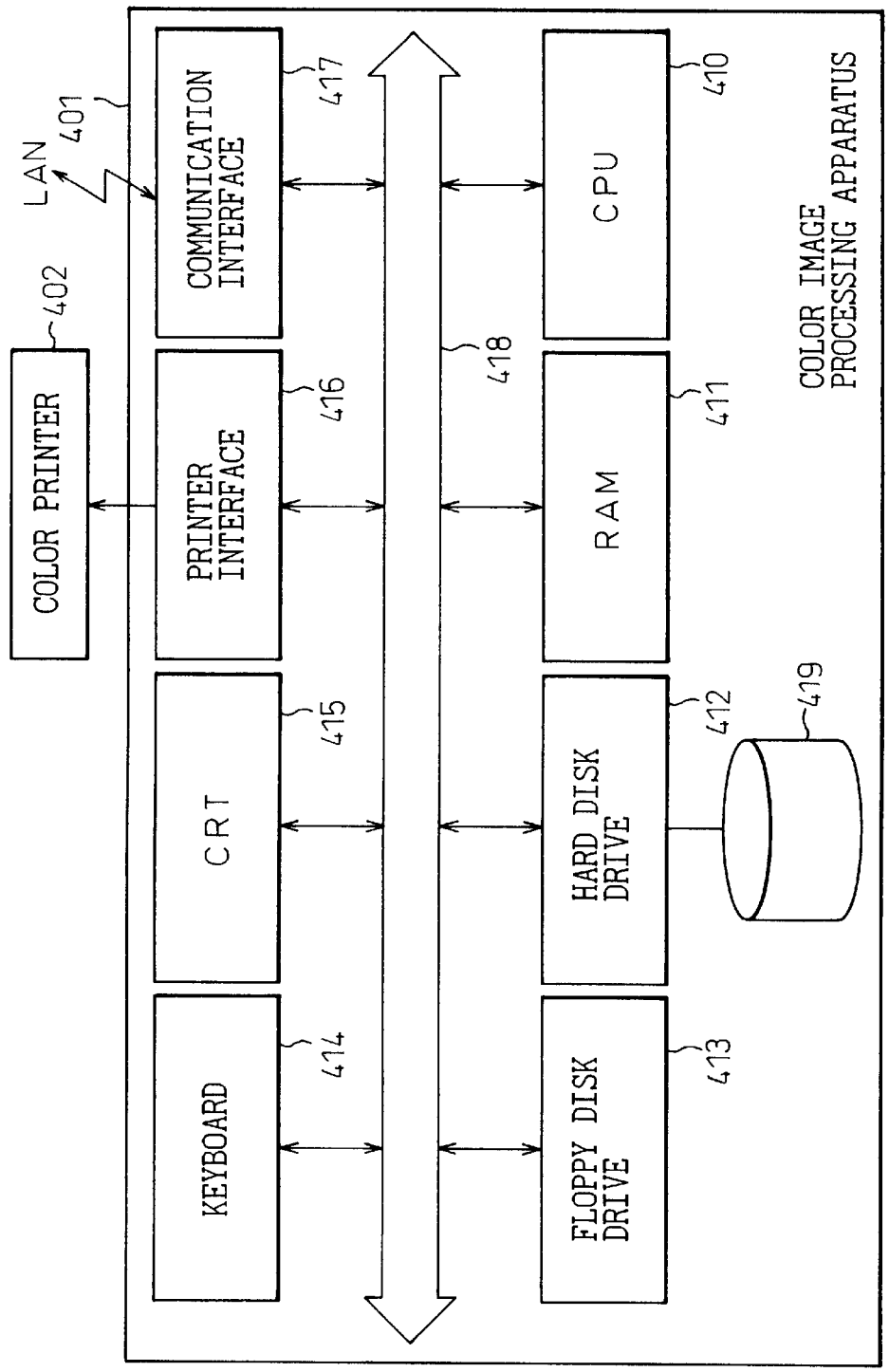

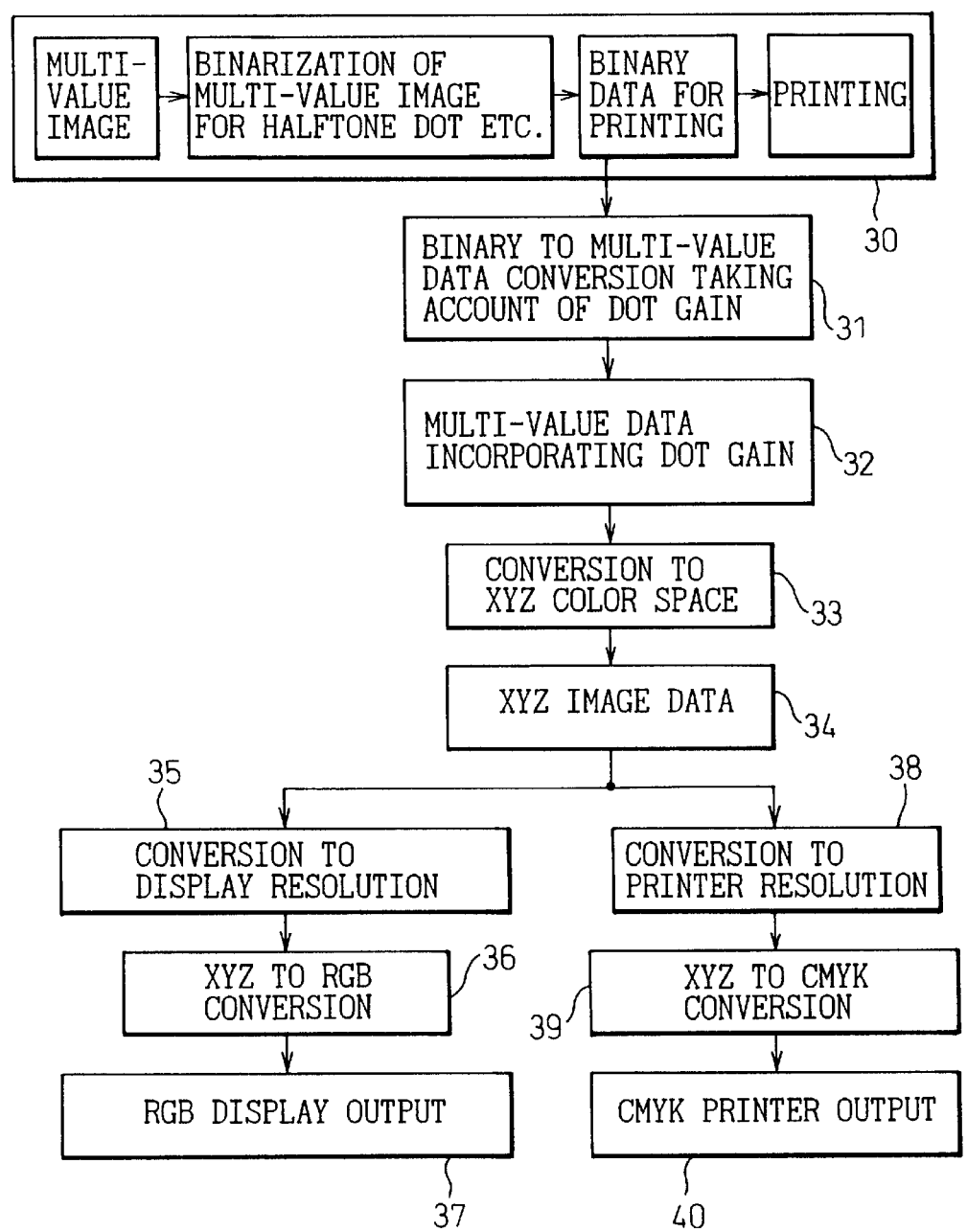

Fig.6A
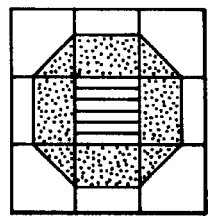
Fig.6B
| 0.3 | 0.6 | 0.3 |
|---|---|---|
| 0.6 | 1.0 | 0.6 |
| 0.3 | 0.6 | 0.3 |
Fig.7
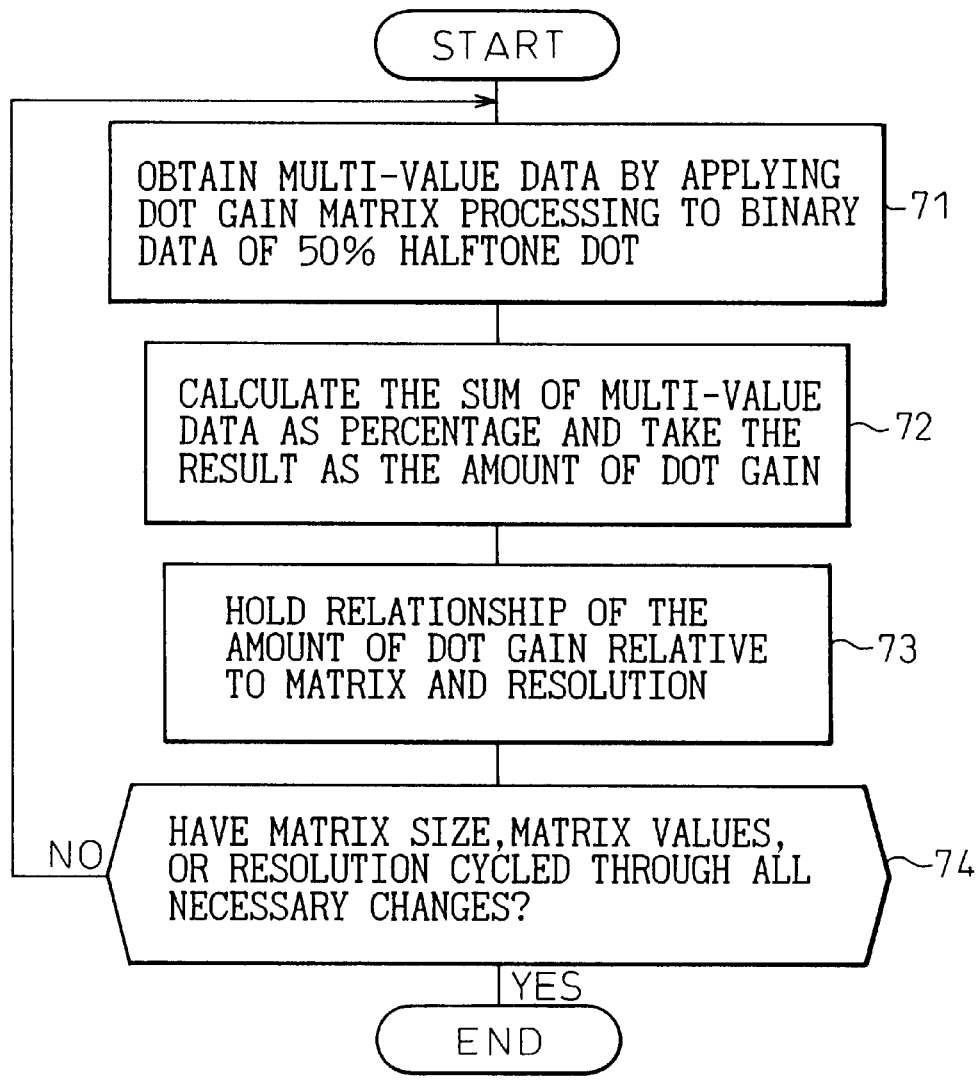

EXAMPLE OF DIFFUSION

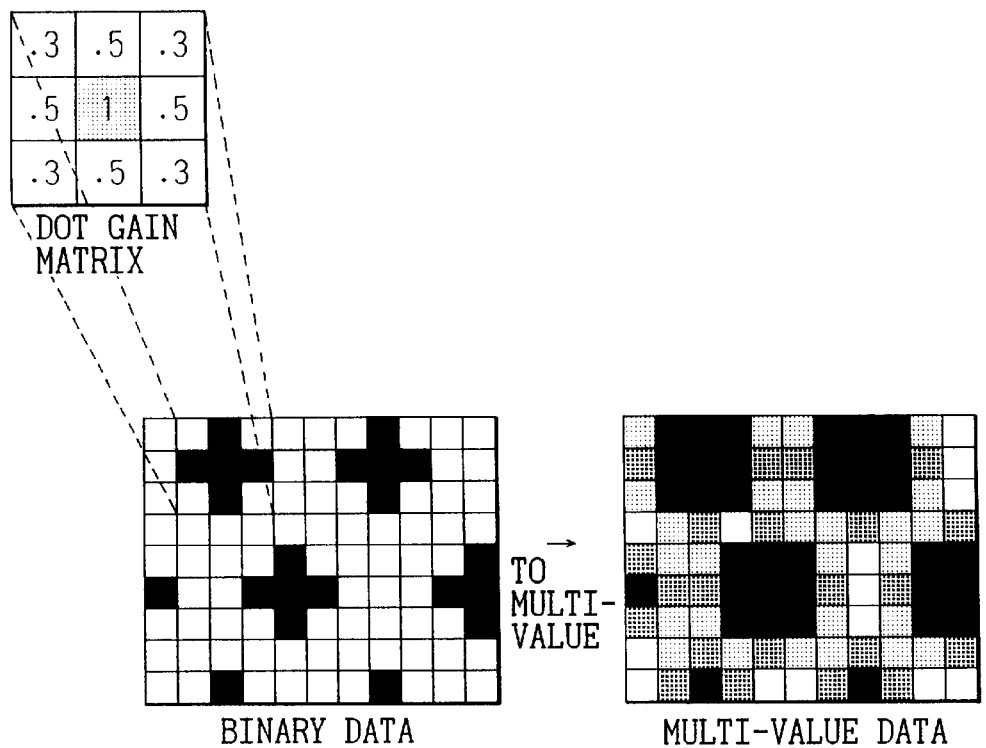

Fig.17

| ADDRESS | | | DATA | | | |
|---|---|---|---|---|---|---|
| X | Y | Z | C | M | Y | K |
| 00000000 | 00000000 | 00000000 | 10111010 | 10111010 | 00100101 | 00011100 |
| 00000000 | 00000000 | 00000001 | 10111010 | 10111010 | 00100101 | 00011100 |
| ≈ | ≈ | ≈ | ≈ | ≈ | ≈ | ≈ |
| 11111111 | 11111111 | 11111110 | 10111010 | 10111010 | 00100101 | 00011100 |
| 11111111 | 11111111 | 11111111 | 10111010 | 10111010 | 00100101 | 00011100 |

24bit / 32bit

Fig.18

| ADDRESS | | | DATA | | |
|---|---|---|---|---|---|
| X | Y | Z | R | G | B |
| 00000000 | 00000000 | 00000000 | 10111010 | 10111010 | 00100101 |
| 00000000 | 00000000 | 00000001 | 10111010 | 10111010 | 00100101 |
| ≈ | ≈ | ≈ | ≈ | ≈ | ≈ |
| 11111111 | 11111111 | 11111110 | 10111010 | 10111010 | 00100101 |
| 11111111 | 11111111 | 11111111 | 10111010 | 10111010 | 00100101 |

24bit / 24bit

Fig.22A

| 255 |

| 153 | 250 | 153 |
| 250 | 255 | 250 |
| 153 | 250 | 153 |

| 51  | 204 | 250 | 204 | 51  |
| 204 | 255 | 255 | 255 | 204 |
| 250 | 255 | 255 | 255 | 250 |
| 204 | 255 | 255 | 255 | 204 |
| 51  | 204 | 250 | 204 | 51  |

|   |   |   |
|---|---|---|
| 0 | 0 | 0 |
| 0 | 255 | 0 |
| 0 | 0 | 0 |

3×3 MATRIX HAVING
THE SAME DOT GAIN
AMOUNT AS 1×1 SIZE

Fig.23B

|   |   |   |   |   |
|---|---|---|---|---|
| 0 | 0 | 0 | 0 | 0 |
| 0 | 153 | 250 | 153 | 0 |
| 0 | 250 | 255 | 250 | 0 |
| 0 | 153 | 250 | 153 | 0 |
| 0 | 0 | 0 | 0 | 0 |

5×5 MATRIX HAVING THE SAME
DOT GAIN AMOUNT AS 3×3 SIZE

MATRIX PATTERN OF RESOLUTION VERSUS DOT GAIN AMOUNT

|  | MATRIX PATTERN (SIZE, VALUE) | | | | | | | | DOT GAIN REPRODUCTION | |
|---|---|---|---|---|---|---|---|---|---|---|
| MATRIX SIZE | 1×1 | 1×1 | 3×3 | 3×3 | 3×3 | 5×5 | 5×5 | 7×7 | 7×7 |
|  | MINIMUM | MAXIMUM | MINIMUM | MIDDLE | MAXIMUM | MINIMUM | MAXIMUM | MINIMUM | MAXIMUM |
| DOT GAIN AMOUNT / RESOLUTION | | | | | | | | | |
| 1 | 0% | 0% | 0% | 50% | 50% | 50% | 50% | 50% | 50% |
| 454 | 0% | 0% | 0% | 30% | 40% | 40% | 50% | 50% | 50% |
| 909 | 0% | 0% | 0% | 25% | 30% | 30% | 35% | 35% | 40% |
| 1200 | 0% | 0% | 0% | 15% | 18% | 18% | 21% | 21% | 24% |
| 3000 | 0% | 0% | 0% | 10% | 12% | 12% | 14% | 14% | 16% |
| 10000 | 0% | 0% | 0% | 5% | 7% | 7% | 8% | 8% | 10% |

Fig.25

| | 1×1 MINIMUM | 1×1 MAXIMUM | 3×3 MINIMUM | 3×3 MIDDLE | 3×3 MAXIMUM | 5×5 MINIMUM | 5×5 MAXIMUM | 7×7 MINIMUM | 7×7 MAXIMUM |
|---|---|---|---|---|---|---|---|---|---|
| A  454 | 0% | 0% | 0% | 30% | 40% | 40% | 50% | 50% | 50% |
| B  909 | 0% | 0% | 0% | 25% | 30% | 30% | 35% | 35% | 40% |

⇩

| C  800 | 0% | 0% | 0% | 26% | 32% | 32% | 39% | 39% | 42% |

EXAMPLE OF CALCULATION $C = (800 - 454) / (909 - 454) * (B - A) + A$

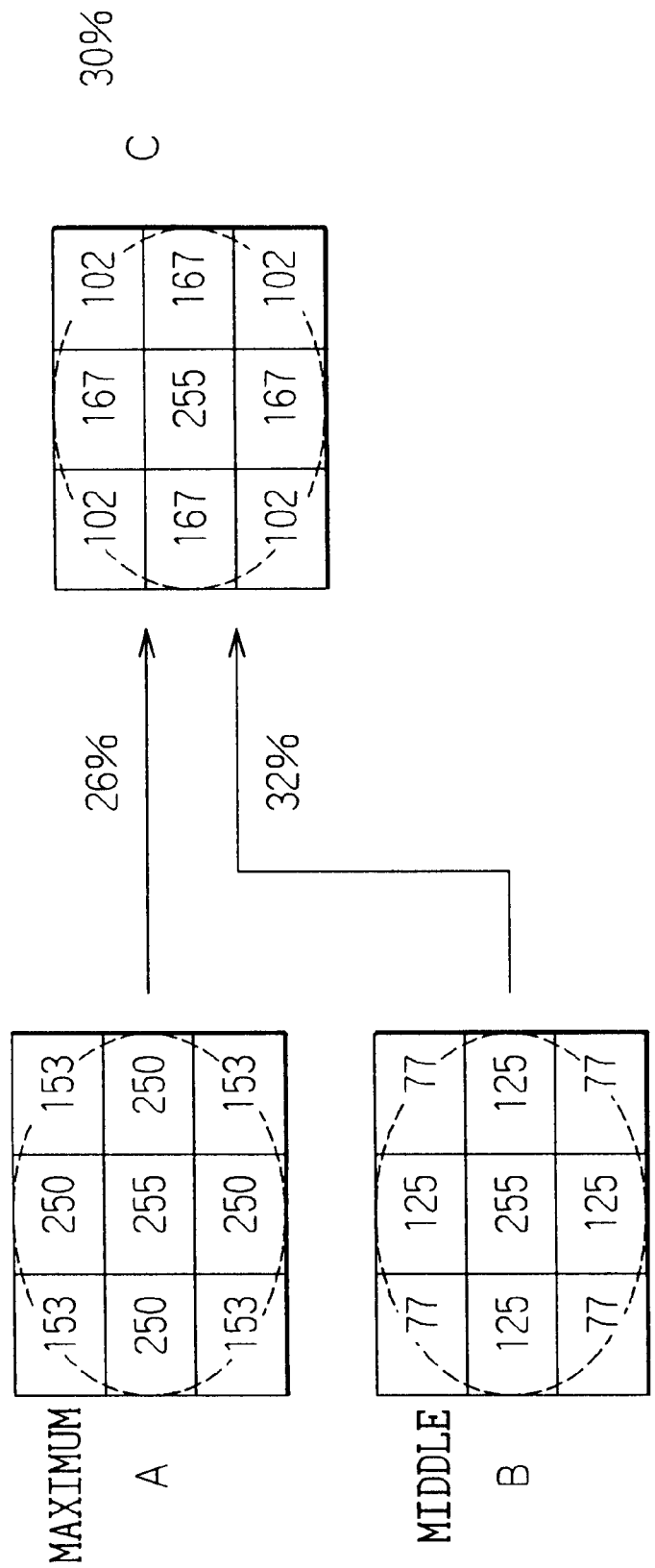

COLOR IMAGE PROCESSING APPARATUS AND RECORDING MEDIUM

BACKGROUND OF THE INVENTION

1. Field of the Invention

The present invention relates to a color image processing apparatus and, more particularly, to a color image processing apparatus that produces a print proof either by outputting a hard copy on a color printer or by displaying an image on a CRT, in either case taking account of halftone dots as well as variations in the operating conditions of a printing press.

2. Description of the Related Art

When producing color printing on a printing press, for example, a web rotary offset printing press, aluminum plates of four colors of CMYK (cyan, magenta, yellow, and black) must first be made in the platemaking step. Printing units for CMYK in a web rotary offset printing press each include a plate cylinder and a rubber cylinder, and the aluminum plate is wrapped around the plate cylinder. Water from a water reservoir is applied to the plate cylinder via water rollers while ink from an ink reservoir is applied to the plate cylinder via ink rollers, and printing is accomplished by transferring the applied ink to a page surface via a blanket wrapped around the rubber cylinder. Usually, in the platemaking step, CMYK plates are binarized by applying halftone dot processing to the multi-value images of CMYK created by reading color images from an original such as a picture or a painting. CMYK films are produced from these binarized plates, and the aluminum plates, that is, the printing plates, are produced from these films; the printing plates are then mounted on the printing press to produce the final printed product.

Many steps have to be performed, as described above, before the final printed product can be obtained, and the process consumes much time and labor. If the color of the final printed product differs from the desired color, the steps involved must be redone, wasting time and labor. Attempts have been made to avoid such wastage by producing a print proof at an early stage of the process. One method, for example, proposes thermally transferring ink to a page using the films. However, this method requires the use of films; besides, it is difficult to make adjustments taking account of dot gain and plate registering in the printing press, and a lot of time and labor is required even with skilled labor.

In view of this, there have recently been proposed color image processing apparatuses that make a printing proof without requiring films. Such color image processing apparatuses create, for example, 700 to 800 patches based on multi-level CMYK values for printing, produce printing plates by binarizing them, obtain first color values by measuring the final printed product obtained through the printing press process, and create first tables for converting the multi-level CMYK values to the first color values. The first color conversion using the first table is a conversion to a color space that does not depend on a device, such as a color printer or a CRT, used to produce an approximate output. Next, 700 to 800 patches, for example, are created based on the multi-level CMYK values to be input to a color printer used as a device for producing an approximate output, and second color values are obtained by producing an output on the color printer; then, a second table is created for converting the color values to the multi-level CMYK values for the color printer. The second color conversion using the second table is a conversion from the device-independent color space to a color space that depends on a device such as a color printer. In this way, the multi-level CMYK values for printing are converted to the multi-level CMYK values for the color printer through the first and second color conversions and output to the color printer to obtain the print proof output.

For the first color conversion, a method is proposed that performs the conversion using Yule-Nielsen or Neugebauer theoretical equations in order to reduce the number of color patches used.

However, with the proofing method according to the above prior art, multi-value images of CMYK have had to be input, and it has not been possible to produce a proof for binary data. Also, the prior art method has had the problem that colors cannot be reproduced with halftone dots since no account is taken of the halftone dots used in printing. Furthermore, patches have had to be output over and over again as the operating conditions of the printing press (printing speed, roller pressures, etc.) change.

SUMMARY OF THE INVENTION

It is, accordingly, an object of the present invention to provide a color image processing apparatus that permits an input of binary data and that is capable of outputting a proof taking account of the reproduction of halftone dots as well as variations in the operating conditions of a printing press.

A color image processing apparatus according to the present invention, which accomplishes the above object, accepts an input of halftoned binary image data and, using a dot gain processing unit, converts the binary data to multi-value data in such a manner as to simulate the amount of dot gain that changes with printing conditions. After conversion to the multi-value image data, the multi-value image data is converted by a device-independent color space converting unit (first color-converting unit) to image data in a device-independent color space. Next, the resolution of the image data is converted by a resolution converting unit to the resolution of an output device. Finally, the multi-value image data converted into the device-independent color space is converted by a device color space converting unit (second color-converting unit) to image data in the color space of the output device, and the thus converted image data is output.

With this configuration, since the dot gain effect is taken into account when performing the binary to multi-value data conversion, correct colors can be reproduced from the binary input, and halftone dots can also be reproduced.

In the above color image processing apparatus, the dot gain processing unit obtains the multi-value image data using a matrix defined by data of pixels surrounding each pixel in the binary image.

This configuration enhances proofing accuracy by capturing the thickening of ink, associated, for example, with a roller pressure in a printing machine, as the spreading of a pixel into its surrounding area.

In the above image processing apparatus, the size of the defined matrix and each row/column value in the matrix are determined by the resolution and the amount of dot gain of the binary image.

With this configuration, a matrix is automatically generated from the resolution and the amount of dot gain of the binary image that determine the matrix size and values.

In the above image processing apparatus, the size of the matrix and each row/column value in the matrix are determined using information such as the number of rows of halftone dots and halftone dot patterns.

With this configuration, more accurate matrix sizes and matrix values can be obtained.

In the above image processing apparatus, the size of the matrix and each row/column value in the matrix are determined independently for each color corresponding to each printing plate.

In the above image processing apparatus, the device-independent color space is a color space where additive color mixing holds.

With this configuration, changes in color are indiscernible to the human eye if the resolution is converted.

In the above image processing apparatus, the first color-converting unit which converts the multi-value image data into the device-independent color space uses a conversion based on Neugebauer theoretical equation.

With this configuration, since the binary to multi-value conversion is performed taking account of the dot gain effect, the dot gain effect need not be taken into account when converting the multi-value image data into the device-independent color space.

In the above image processing apparatus, after converting the multi-value image data, converted into the device-independent color space, to image data in the color space of the output device, the second color-converting unit converts the image data to binary image data using an error diffusion method and outputs the binary image data onto the output device.

This configuration serves to prevent the occurrence of moire resulting from the halftoned binary data.

The above image processing apparatus includes a gray adjusting unit for making gray adjustments by inputting the color of printing paper and the white color of the output device into the device-independent color space.

This configuration enables the printing paper to be reproduced as the white color of the output device.

The above image processing apparatus includes: a resolution adjusting unit for receiving an input of binary image data output at a plurality of resolutions and, after converting the binary image to a multi-value image for each resolution, adjusting the resolution of the multi-value image to the highest of the plurality of resolutions; and a color combining unit for combining the multi-value images on a color-by-color basis.

This configuration prevents degradation of image quality.

In the above image processing apparatus, the size of the defined matrix and each row/column value in the matrix are determined by sharpness.

With this configuration, fine adjustments can be made in the reproduction of halftone dots.

In the above image processing apparatus, the dot gain processing unit, which receives the input of the halftoned binary image data and converts the binary image data to multi-value image data corresponding to the amount of dot gain of each color, calculates data of each pixel by: entering all combinations of binary data of pixels surrounding the pixel; storing the combinations in the device-independent color space; performing dot gain processing and device-independent conversion processing; and creating a table from the results of the processing.

Using the table created by the above configuration, processing can be performed at high speed.

To achieve the aforementioned object, the invention also provides a recording medium readable by a computer and used in a color image processing apparatus for producing a print proof, the recording medium having a program recorded thereon for making the computer implement the functions of: a dot gain processing unit for receiving an input of halftoned binary image data, and for converting the binary image data to multi-value image data corresponding to the amount of dot gain of each color; a first color-converting unit for converting the multi-value image data to image data in a device-independent color space; a resolution converting unit for changing the resolution of the multi-value image in the device-independent color space to match the resolution of an output device; and a second color-converting unit for converting the multi-value image data, converted into the device-independent color space, to image data in a color space associated with the output device.

BRIEF DESCRIPTION OF THE DRAWINGS

FIG. 4 is a block diagram showing the configuration of one embodiment of a color image processing apparatus according to the present invention.

FIG. 5 is a flowchart illustrating a processing routine according to a first embodiment.

FIGS. 6A and 6B are diagrams for explaining binary dot gain.

FIG. 7 is a flowchart illustrating a processing routine according to a second embodiment.

FIG. 15 is a diagram showing a specific example of how binary data is converted to multi-value data by dot gain matrix processing.

FIG. 16 is a diagram showing a specific example of a first color-conversion table.

FIG. 17 is a diagram showing a specific example of a second color-conversion table.

FIG. 18 is a diagram showing another specific example of the second color-conversion table.

FIGS. 22A to 22D are diagrams showing an example of creating dot gain matrices in which values are so set as to provide the largest dot gain within the respective matrix sizes.

FIGS. 23A to 23C are diagrams showing an example of creating a matrix expressing the same amount of dot gain as a smaller matrix.

FIG. 24 is a table showing a matrix pattern of resolution versus the amount of dot gain.

FIG. 25 is a diagram showing an example of calculating the amount of dot gain for a resolution not shown in the table.

FIG. 26 is a diagram showing an example of creating, from two matrices expressing different dot gain amounts, a matrix expressing a dot gain amount intermediate between them.

DESCRIPTION OF THE PREFERRED EMBODIMENTS

Figure 1:
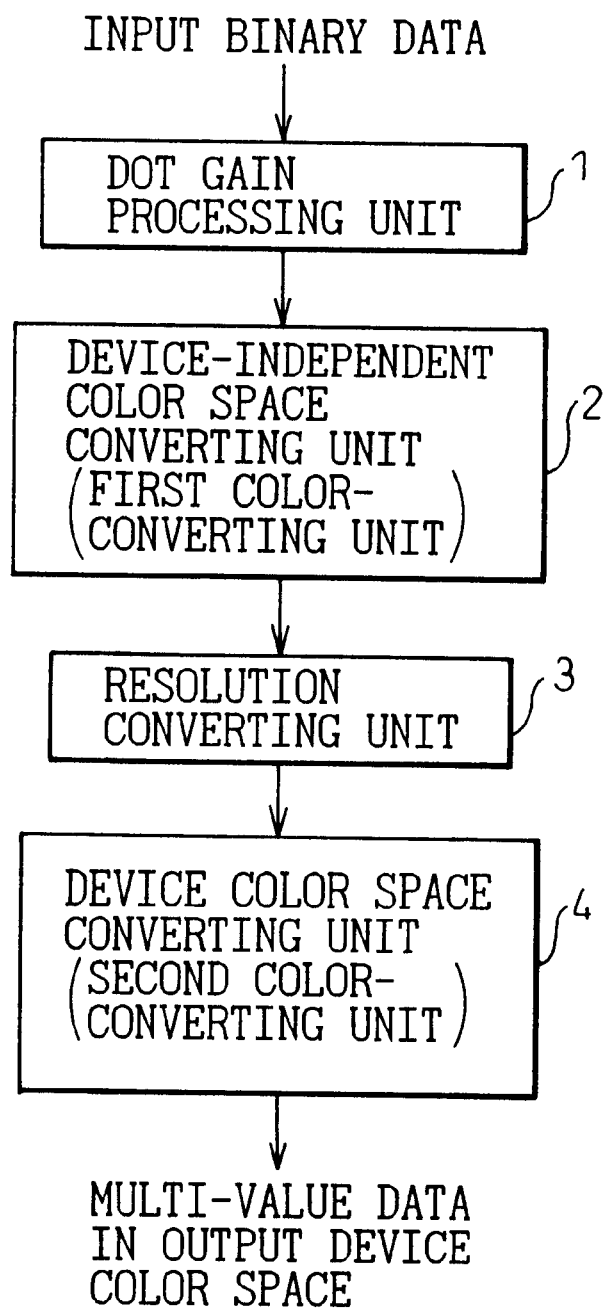
FIG. 1 is a block diagram showing the basic configuration of the present invention.

Embodiments of the present invention will be described in detail below with reference to the accompanying drawings. Throughout the drawings, like elements are designated by like reference numerals.

FIG. 1 is a block diagram showing the basic configuration of the present invention.

The color image processing apparatus, according to the present invention, that accomplishes the aforementioned object accepts an input of halftoned binary image data and, using a dot gain processing unit 1, converts the binary data to multi-value data in such a manner as to simulate the amount of dot gain that changes with printing conditions. The multi-value image data is then fed to a device-independent color space converting unit (first color-converting unit) 2 where it is converted to image data in a device-independent color space. Next, the resolution of the image data is converted by a resolution converting unit 3 to the resolution of the output device. Finally, the multi-value image data converted into the device-independent color space is converted by a device color space converting unit (second color-converting unit) 4 to image data in the color space of the output device, and the thus converted image data is output. In this way, by taking into account the dot gain effect when performing the binary to multi-value data conversion, correct colors can be reproduced from the binary input, and halftone dots can also be reproduced.

Figure 2:
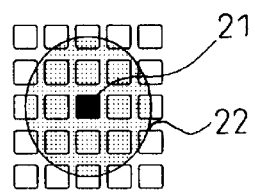
FIG. 2 is a diagram for explaining dot gain.

FIG. 2 is a diagram for explaining the dot gain. The dot gain effect is a phenomenon in which when printing on a printer, ink spreads into an area 22 surrounding a halftoned binary data dot 21, depending on printing conditions such as a roller pressure, and the amount of dot gain refers to the amount of ink spreading. As shown in FIG. 2, due to the dot gain, the binary data dot 21 is printed spreading into the surrounding area 22.

Figure 3:
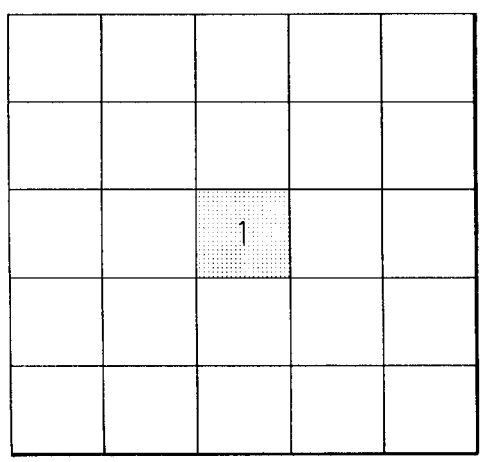
FIG. 3 is a diagram showing a specific example of matrix processing of dot gain.

FIG. 3 shows a specific example of matrix processing of the dot gain. To simulate the dot gain, processing is performed to assign data in the neighborhood of each of the CMYK binary data by taking account of ink spreading. As shown in FIG. 3, each value assigned is determined in relation to the position relative to the binary data, and thus the binary data of CMYK are converted to the multi-value data of CMYK. This processing is performed by matrix operations.

FIG. 4 is a diagram showing the configuration of one embodiment of the color image processing apparatus according to the present invention. The color image processing apparatus 401 shown in FIG. 4 is connected via a LAN to a workstation installed at a remote location. The workstation generates binary data by binarizing each of the C, M, Y, and K plates by applying halftoning to the CMYK multi-value image data that were created from character data read from a recording medium such as a floppy disk or entered from a keyboard, and from color image data read from an original, such as a picture or a painting, using a scanner or the like. This binary data is input to the color image processing apparatus 401, and after performing the process hereinafter described, the color image processing apparatus 401 outputs a hard copy on a color printer 402 or displays the image on a CRT 415.

The color image processing apparatus 401 comprises a CPU 410, RAM 411, hard disk drive 412, floppy disk drive 413, keyboard 414, CRT 415, printer interface 416, communication interface 417, etc. which are interconnected by a bus line 418 for bidirectional communication. The color image processing apparatus 401 further includes a hard disk 419, connected to the hard disk drive 412, for storing programs and tables necessary to perform the various steps hereinafter described.

Referring to FIG. 4, a brief description will be given of the processing of the program recorded on the recording medium of the present invention. The color image processing apparatus of the invention generally shown in FIG. 4 is a computer system comprising the central processing unit (CPU) 410 and recording media such as the RAM 411 and magnetic disk 419. This computer system is equipped with the floppy disk drive 413 for a removable recording medium (not shown) such as a floppy disk, and the hard disk drive 412. By performing a prescribed operation, the program recorded on a removable recording medium, such as a floppy disk, for having the computer execute the steps of the present invention, is read via the floppy disk drive 413 or the hard disk drive 412 and loaded into the RAM 411. Of course, an operator may directly write the program into the RAM 411 in the computer system by using an input means such as the keyboard 411. Alternatively, the program may be stored, for example, in a RAM (not shown), a recording medium installed in a client's computer system (not shown), and the program may be sent over the LAN (communication line) and loaded via a terminal unit (not shown) into the RAM 411 in the computer system shown here. Thereafter, the program loaded in the RAM 411 is executed as necessary in accordance with the processing performed by the CPU 410 of the computer system.

FIG. 5 is a flowchart illustrating a processing routine according to a first embodiment. The illustrated example shows the case where a proof is produced simulating a monochrome print output. In FIG. 5, the section enclosed by a rectangle 30 shows the flow of usual monochrome printing. In step 30 of FIG. 5, multi-value image data is subjected to halftoning to create binary image data based on which printing is performed. In the binary to multi-value data conversion simulating the dot gain, in step 31 of FIG. 5 the binary image data created in step 30 is converted to multi-value data by taking into account the amount of dot gain.

FIGS. 6A and 6B are diagrams for explaining binary dot gain. The amount of dot gain shown in FIG. 6A is expressed in the form of a matrix as shown in FIG. 6B, and multi-level values can be calculated using equation 1 below.

$$\text{Multi-level value of center pixel} = \Sigma(\text{pixel value (1 or 0)} \times \text{matrix value}) \quad (1)$$

where the multi-level value is between 0 and 1, and 1 when the multi-level value of the center pixel exceeds 1. The matrix of FIG. 6A is 3×3 in size, but if the amount of dot gain is too large to fit in the 3×3 matrix, the matrix size is increased. In this way, the multi-value data incorporating the dot gain is calculated in step 32 of FIG. 5. The above steps 31 and 32 are carried out in the dot gain processing unit shown in FIG. 1. By taking account of the neighboring pixels, a color proof that matches the operating conditions of the printing press, for example, the roller pressure, can be obtained.

In the XYZ color space conversion in step 33 of FIG. 5, the multi-value data with predicted dot gain is converted to values in the XYZ color space, and XYZ image data is obtained in step 34. These steps 33 and 34 are carried out in the device-independent color space converting unit shown in FIG. 1. In the case of monochrome, the conversion is performed using equation 2 below.

XYZ values of attention pixel=(XYZ values of black pixel)× (multi-value data)+(XYZ values of white pixel)×(1−multi-value data) (2)

In the above equation, it is assumed that the multi-value data is normalized to the range of 0 to 1.

In steps 35, 36, and 37 of FIG. 5, to produce an output on the CRT as a device, the resolution is increased or reduced to match the resolution of the CRT display (step 35), XYZ-to-RGB conversion is performed (step 36), and the RGB output is produced on the CRT display (step 37).

In steps 38, 39, and 40 of FIG. 5, to produce an output on the color printer as a device, the resolution is increased or reduced to match the resolution of the color printer (step 38), XYZ-to-CMYK conversion is performed (step 39), and the CMYK output is produced on the color printer (step 40).

The above steps 35 and 38 are carried out in the resolution converting unit 3 shown in FIG. 1, while the steps 36, 39, and 40 are carried out in the device color space converting unit 4.

FIG. 7 is a flowchart illustrating a processing routine according to a second embodiment. In step 71, binary data of 50% halftone dots is subjected to dot gain processing using the matrix, to obtain multi-value data. In step 72, the sum of the multi-value data is calculated in terms of percentage, and the result is taken as the amount of dot gain. In step 73, the relationship of the amount of dot gain relative to the matrix and resolution is held intact. In step 74, a decision is made as to whether the matrix size, matrix values, or the kind of halftone dot (resolution) have cycled through all necessary changes; if the answer to the decision is YES, the routine is terminated, but if the answer is NO, the process returns to step 71.

By repeating steps 71 to 73, the relationship between the resolution and the amount of dot gain for various matrices can be obtained. When the resolution and the amount of dot gain are determined, the corresponding matrix size and values can be derived using the above relationship.

If information concerning the number of rows of halftone dots (spacing between periodically appearing halftone dots) and halftone dot patterns is added to the resolution as the kind of halftone dot, more accurate matrix size and matrix values can be derived.

Figure 8:
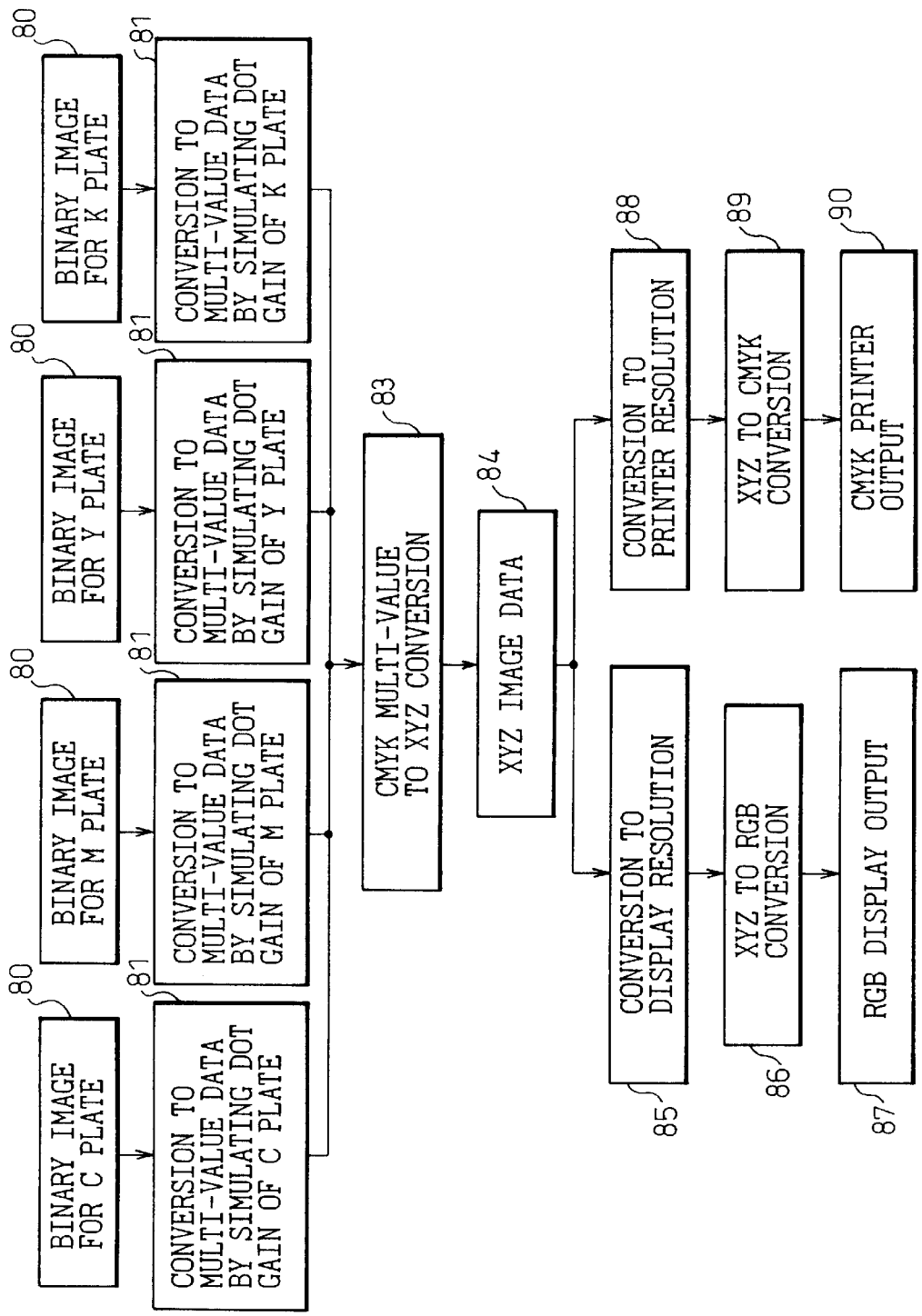
FIG. 8 is a flowchart illustrating a processing routine according to a third embodiment.

FIG. 8 is a flowchart illustrating a processing routine according to a third embodiment. In step 80, binary image data for each plate is created, and in step 81, the data is converted to multi-value data by performing simulation taking into account the amount of dot gain for each of the C, M, Y, and K plates. Steps 83 to 90 in FIG. 8 correspond to the respective steps 33 to 40 in FIG. 5, and perform the same processing as the corresponding steps.

Figure 9:
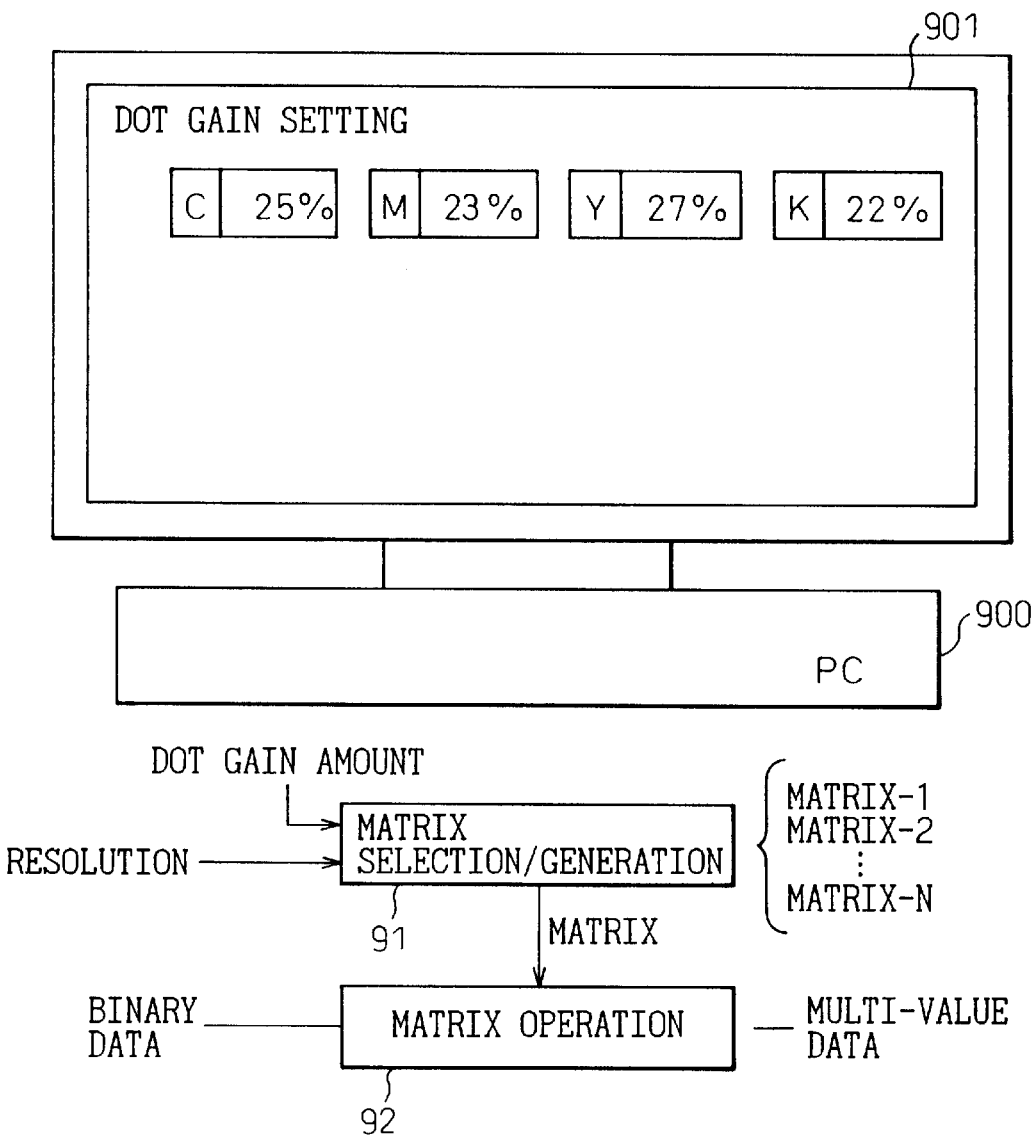
FIG. 9 is a diagram showing a fourth embodiment.

FIG. 9 is a diagram showing a fourth embodiment. As shown in FIG. 9, the amount of dot gain for each of the C, M, Y, and K plates is adjusted on a CRT screen 901 of a personal computer 900. In step 91, the appropriate matrix is selected or generated in accordance with the amount of dot gain thus adjusted and the resolution of the binary data. In step 92, multi-value data is created by performing a matrix operation between the generated matrix and the binary data. In the example shown in FIG. 9, the amount of dot gain for the four CMYK plates of 50% halftone dot is set at 25%, 23%, 27%, and 22%, respectively.

Figure 10:
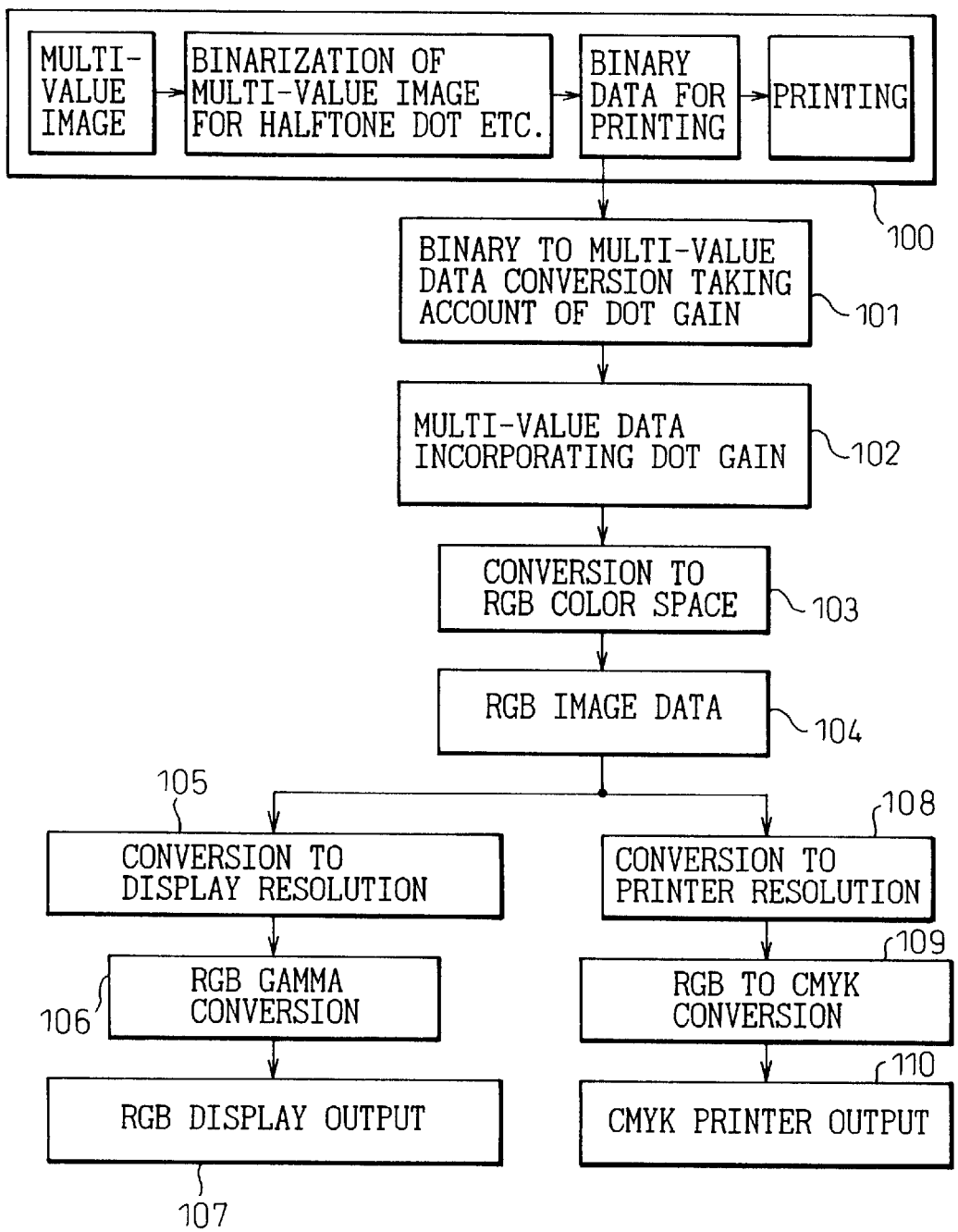
FIG. 10 is a flowchart illustrating a processing routine according to fifth and sixth embodiments.

FIG. 10 is a flowchart illustrating a processing routine according to fifth and sixth embodiments. In FIG. 10, steps 100 to 110 correspond to the respective steps 30 to 40 in FIG. 5. The difference from FIG. 5 is that the RGB color space is used as the device-independent color space. The XYZ color space may be used as the device-independent color space, as shown in FIG. 5, or the RGB color space where the gamma is unity may be used, as shown in FIG. 10. The RGB color space is a space where additive color mixing holds. With this configuration, the output can be display at high speed since only the gamma conversion is necessary in the color conversion when producing the display. Furthermore, if the resolution is converted, since additive color mixing holds, any changes in color are indiscernible to the human eye.

In the configuration of FIG. 5, when performing the color conversion using Neugebauer theoretical equation according to the sixth embodiment, calculations are performed using the XYZ color values of the 16 colors given below. This enables the multi-value image to be color converted into the device-independent space without taking account of the dot gain.

The 16 colors are paper white, C 100%, M 100%, Y 100%, CM 100%, MY 100%, YC 100%, CMY 100%, CK 100%, MK 100%, YK 100%, CMK 100%, CYK 100%, MYK 100%, CMYK 100%, and K 100%.

Figure 11:
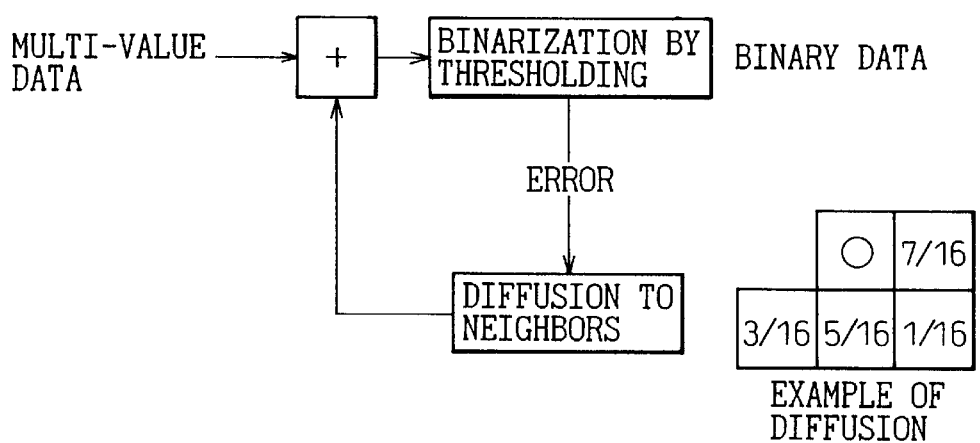
FIG. 11 is a diagram showing a seventh embodiment.

FIG. 11 is a diagram showing a seventh embodiment. As shown in FIG. 11, multi-value data is binarized by using a prescribed threshold value, and any difference arising from the binarization is calculated as an error, which is diffused in such a manner as to be added to neighboring multi-value data. Binarization is performed by repeating this processing.

Figure 12:
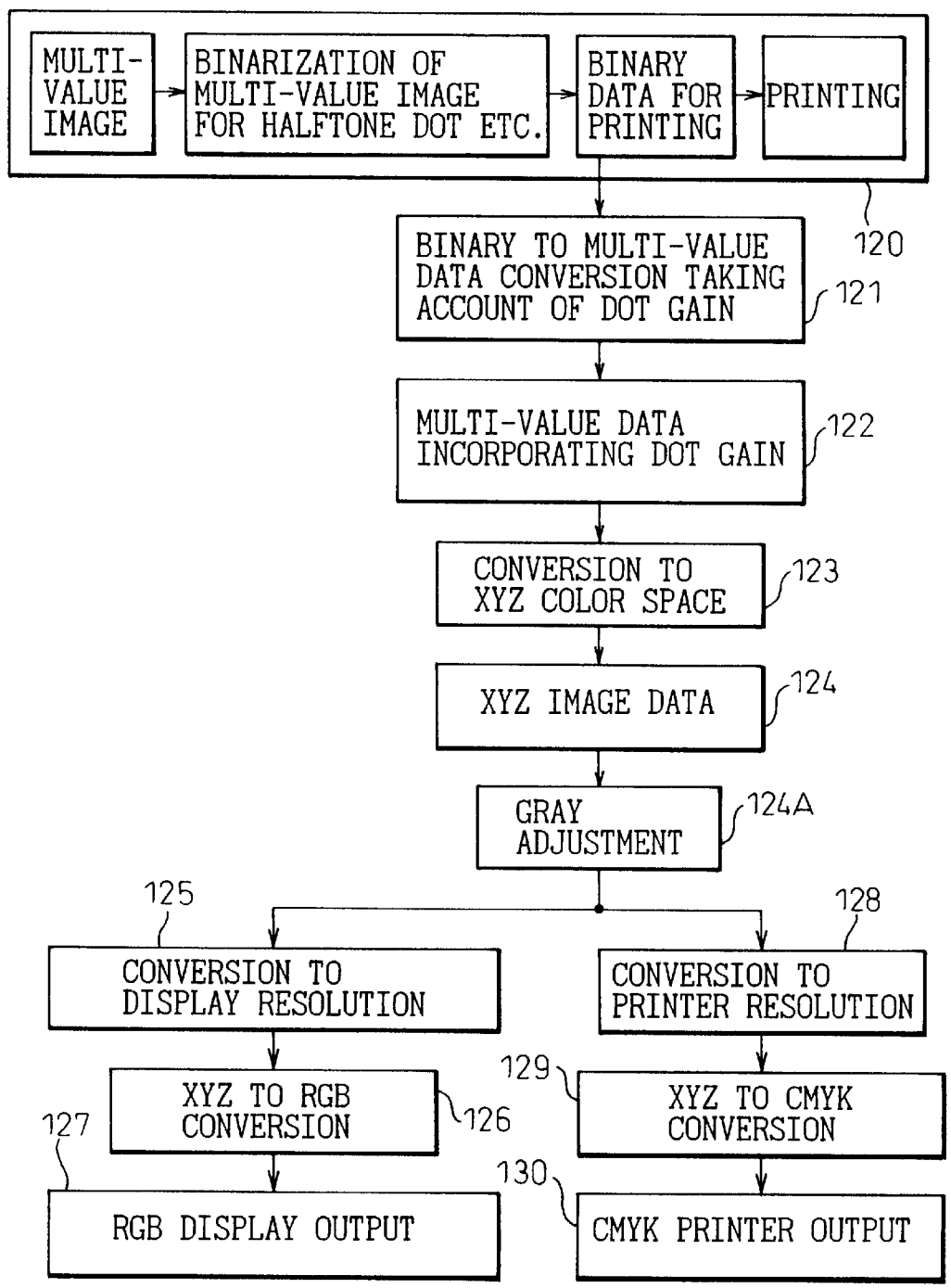
FIG. 12 is a flowchart illustrating a processing routine according to an eighth embodiment.

FIG. 12 is a flowchart illustrating a processing routine according to an eighth embodiment. In FIG. 12, steps 120 to 130 correspond to the respective steps 30 to 40 in FIG. 5, the only difference being the addition of step 124A. As shown in FIG. 12, a gray adjusting means 124A is provided. The gray adjusting means is used when it is desired to match the white color of the paper printed on the printing press to the white color of the paper printed on the printer. In the gray adjusting means 124A, when the XYZ values of printing paper white are denoted as Xw, Yw, and Zw, those of the white color of the output device as Xd, Yd, and zd, and the input XYZ values as Xi, Yi, Zi, then the XYZ values, Xo, Yo, and Zo, after conversion, can be calculated from the following equations.

$$X_o=(X_d/X_w)/X_i \tag{3}$$

$$Y_o=(Y_d/Y_w)/Y_i \tag{4}$$

$$Z_o=(Z_d/Z_w)/Z_i \tag{5}$$

Figure 13:
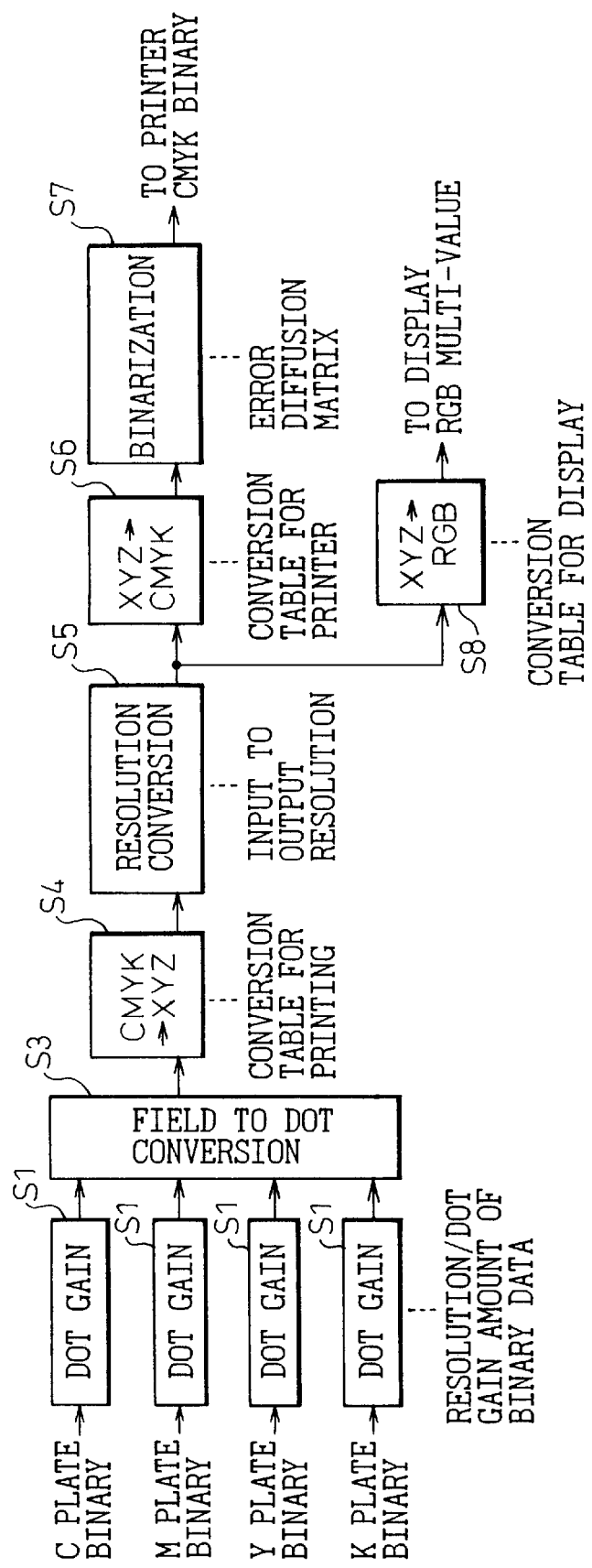
FIG. 13 is a flowchart illustrating a processing routine according to the first embodiment.

FIG. 13 is a flowchart illustrating a processing routine according to the first embodiment. Step S1 and steps S3 to S8 indicate the order of processing. The processing routine of the first embodiment shows an example in which one image is formed with one resolution. The flowchart shown in FIG. 13 corresponds to the steps 31 to 40 in the flowchart shown in FIG. 5, and the resolution conversion is shown as being carried out in one step.

Figure 14:
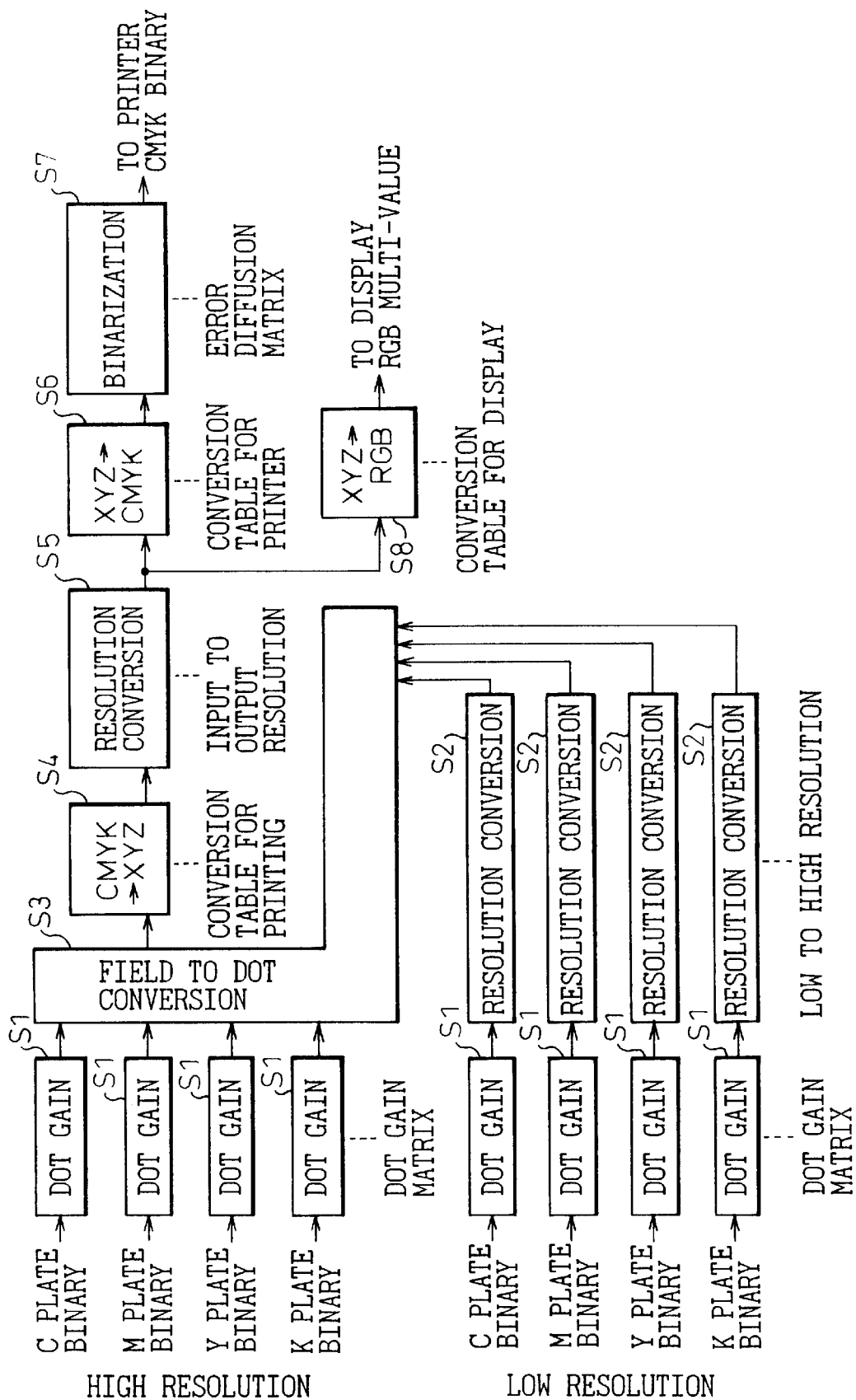
FIG. 14 is a flowchart illustrating a processing routine according to a ninth embodiment.

FIG. 14 is a flowchart illustrating a processing routine according to a ninth embodiment. Steps S1 to S8 indicate the order of processing. The processing routine of the ninth embodiment shows an example in which one image is formed with a plurality of resolutions. As can be seen from a comparison with FIG. 13, the example shown in FIG. 14 differs in that dot gain processing is applied to both high resolution and low resolution data, in that step S2 is included for resolution conversion, and in that step S3 performs processing to combine images.

FIG. 15 is a diagram showing a specific example of how binary data is converted to multi-value data by dot gain matrix processing. In step S1, a matrix operation is applied to the binary data of each of the C, M, Y, K plates for conversion into multi-value data. The value of "1" at the center of the dot gain matrix shown in FIG. 15, that is, the multi-value data, is calculated as shown below from the binary data and the matrix values.

$$\text{Value at center} = (0.3 \times 1 + 1.0 \times 1 + 0.5 \times 1 + 0.3 \times 1 \times 255 \quad (6)$$
$$= 255 \text{ (any value greater than 255 is given the value 255)} \ldots$$

The above example shows the dot gain matrix of 3×3 size, but the matrix size and values in the matrix are changed according to the amount of dot gain and the input resolution.

The processing in step S2 (resolution conversion) is performed using bi-linear interpolation. When an image is enlarged or reduced as a result of the resolution conversion, a pixel value occurs at a non-lattice point. This pixel value is calculated by bi-linear interpolation from the pixel values at the four neighboring lattice points. The resolution conversion may be performed using a nearest neighbor method or a cubic convolution method instead of the bi-linear interpolation.

In the processing in step S3 (field to dot conversion), field sequential data is converted to dot sequential data. Taking three pixels as an example, the field sequential data, $C_1$, $C_2$, $C_3$, $M_1$, $M_2$, $M_3$, $Y_1$, $Y_2$, $Y_3$, $K_1$, $K_2$, $K_3$, of the C, M, Y, and Y plates is converted to the dot sequential data, $C_1$, $M_1$, $Y_1$, $K_1$, $C_2$, $M_2$, $Y_2$, $K_2$, $C_3$, $M_3$, $Y_3$, $K_3$, of the C, M, Y, and K pixels.

FIG. 16 is a diagram showing a specific example of a first color-conversion table.

In the processing in step S4 (color conversion for printing), data referred to by an address consisting of a total of 24 bits, i.e., high-order 6 bits from each of the multi-level CMYK values, is converted to XYZ values by using the table shown in FIG. 16.

In the processing in step S5 (resolution conversion), the input resolution is converted to match the output conversion. In this processing, the resolution of only the low-resolution binary data is converted to the same resolution as the high-resolution data.

FIG. 17 is a diagram showing a specific example of a second color-conversion table.

In the processing in step S6 (color conversion for printer), data referred to by an address consisting of a total of 24 bits, i.e., 8 bits from each of the XYZ values, is converted to multi-level CMYK values by using the table shown in FIG. 17.

In the binarization in step S7, the multi-level CMYK values are binarized using an error diffusion method.

FIG. 18 is a diagram showing another specific example of the second color-conversion table.

In the processing in step S8 (color conversion for display), data referred to by an address consisting of a total of 24 bits, i.e., 8 bits from each of the XYZ values, is converted to RGB values by using the table shown in FIG. 18.

Figure 19:
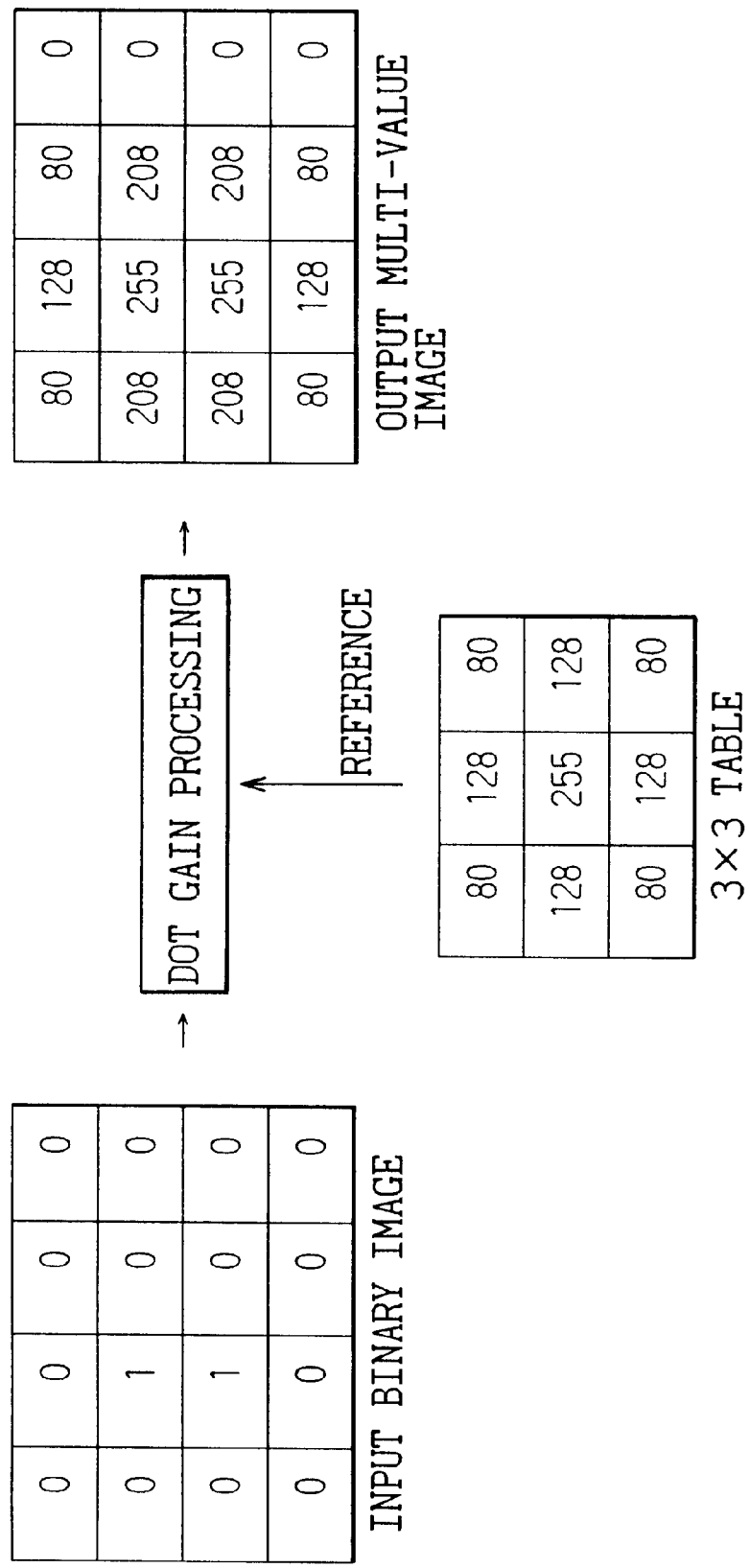
FIG. 19 is a diagram for explaining a method of creating a dot gain table.

FIG. 19 is a diagram for explaining a method of creating a dot gain table. The dot gain matrix is incorporated into the dot gain processing (filtering) for converting binary data to multi-value data, and defines the way the binary data is expanded for conversion to multi-value data. The table determines the amount of dot gain by the dimension of the matrix and its table values. In this way, the matrix size and values are determined by the amount of dot gain.

Figure 20:
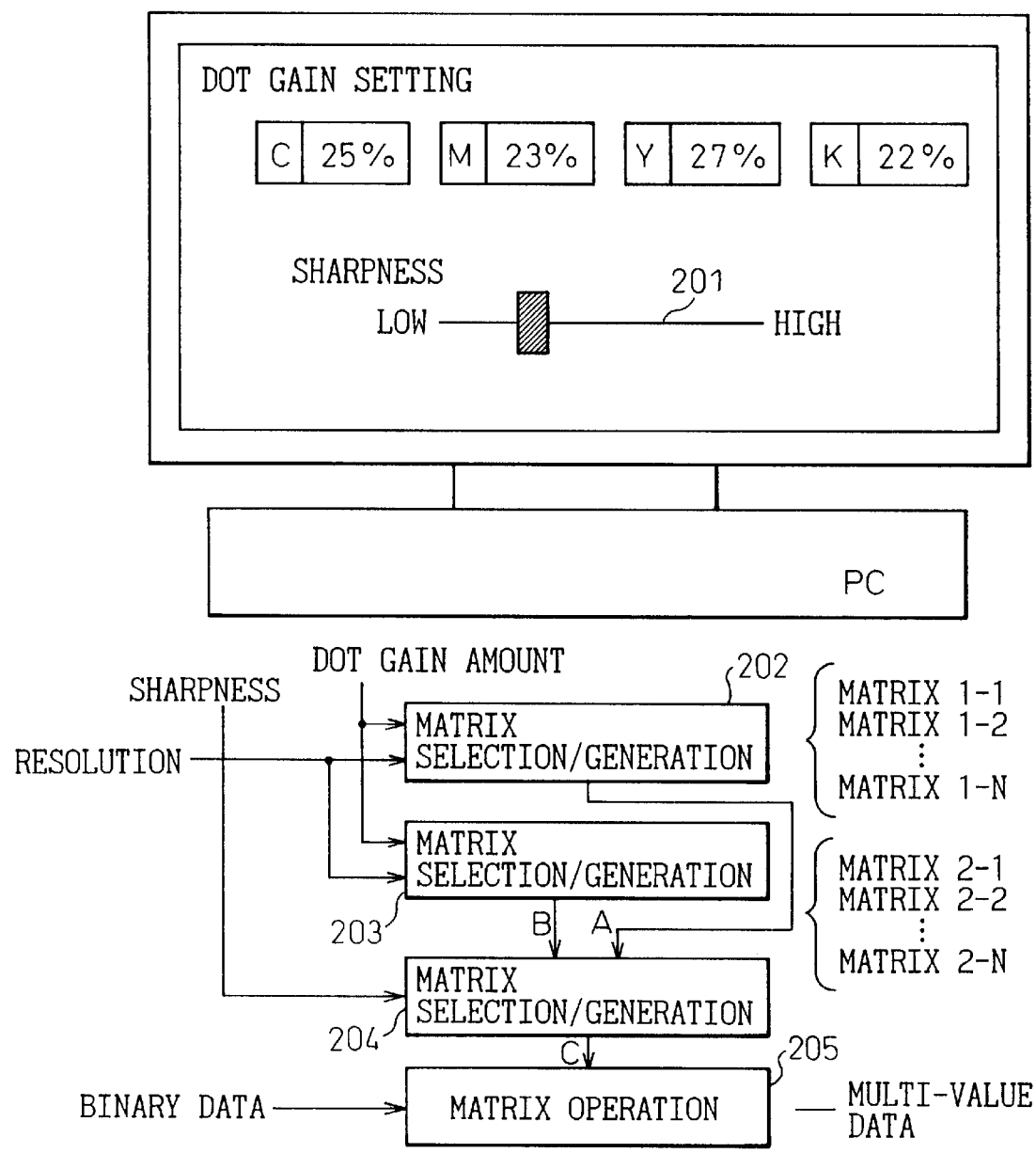
FIG. 20 is a diagram showing a 10th embodiment.

FIG. 20 is a diagram showing a 10th embodiment. As shown in FIG. 20, the amount of dot gain is made adjustable, and a sharpness bar 201 is provided so that the sharpness can be adjusted. Matrix 1 and matrix 2 have matrix distributions with different degrees of neighborhood influence. Here, matrices A and B output from matrix selection/generation means 202 and 203 are used to obtain matrix C from a matrix selection/generation means 204 in accordance with sharpness parameter S. Assuming the range of sharpness S to be 1 to 0, then $$\text{Matrix } C = \text{Matrix } A \times S + \text{Matrix} \times (1-S) \quad (7)$$

A matrix operation unit 205 performs the calculation of the above equation (7). When the sharpness is set high, a matrix with a smaller neighborhood influence range is selected, and when the sharpness is set low, a matrix with a larger neighborhood influence range is selected. By providing such adjusting means, fine adjustment of halftone dot reproduction becomes possible, and the dot gain that will occur in printing can be simulated.

Figure 21:
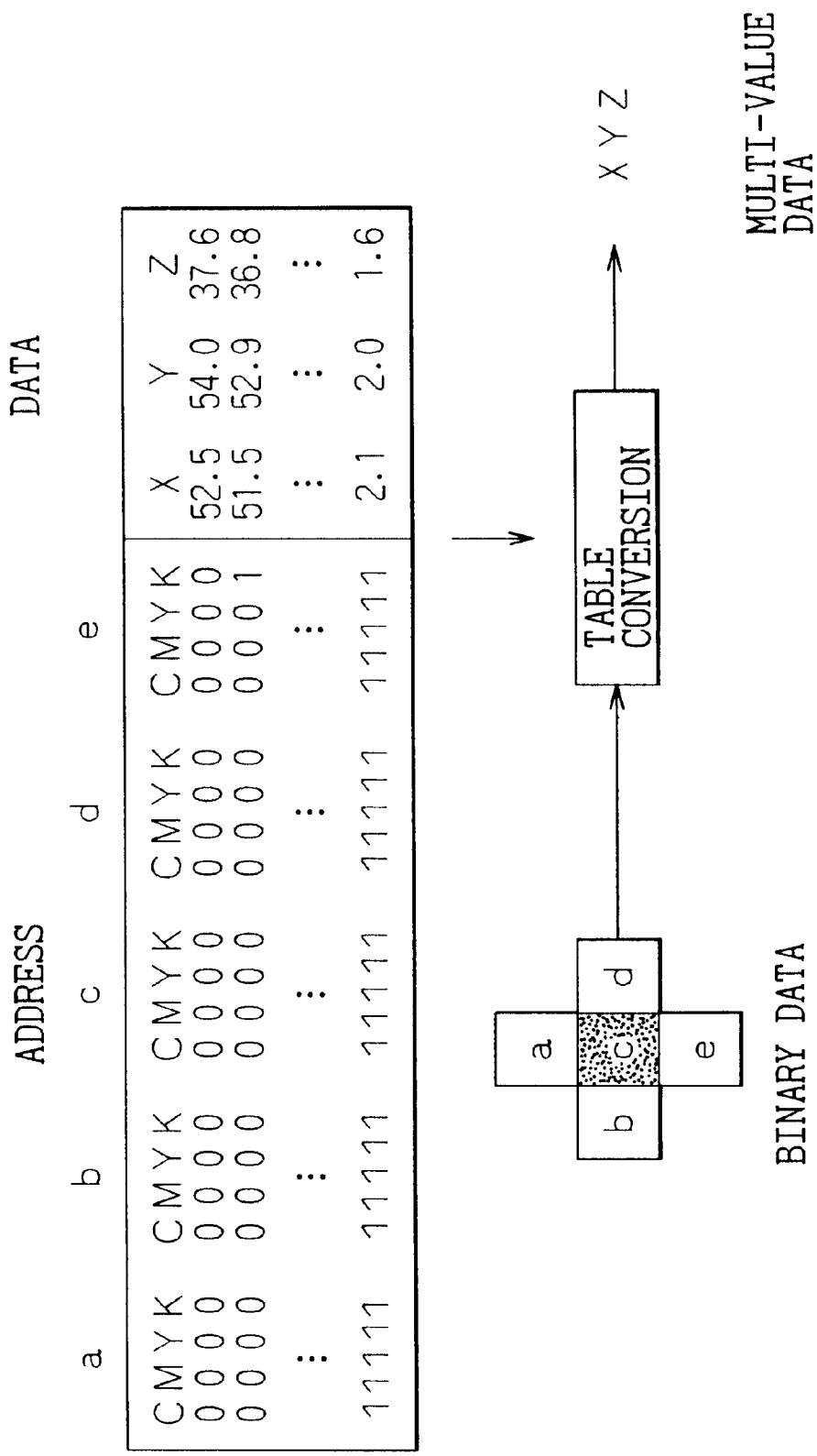
FIG. 21 is a diagram showing an 11th embodiment.

FIG. 21 is a diagram showing an 11th embodiment. As shown in FIG. 21, the XYZ values of the pixel at the center C are obtained using a total of five pixels consisting of the center pixel c and the four neighboring pixels a, b, c, and e of the binary data. To calculate the table, the address part in FIG. 21 is input as the binary data, the dot gain processing and device-independent color space conversion processing are performed, and the results are stored as table data. With the conversion using this table, the dot gain processing and device-independent color space conversion processing can be performed at a time, achieving faster processing speed.

The following describes how the matrix selection can be made faster. This is accomplished by selecting a matrix optimum for the amount of dot gain.

Optimum conditions include the following.

1. The amount of dot gain can be accurately reproduced (enhanced quality).

For this purpose, while holding the relationship of the matrix size and values relative to the amount of dot gain and resolution, the matrix is selected or automatically generated as needed.

2. The matrix size is kept as small as possible as long as it can reproduce the desired amount of dot gain (for faster processing speed).

For this purpose, for each matrix, values are set so that the largest possible dot gain amount can be reproduced with its size, and it is made possible to interpolate between each size.

3. Dot gain shape (value) is continuous (high quality).

For this purpose, matrix values are set in such a manner as to spread radially from the center in accordance with the matrix size; if a matrix corresponding to the amount of dot gain and resolution does not exist, the matrix is obtained by interpolating between two dot matrices, thus eliminating discontinuities.

FIGS. 22A to 22D are diagrams showing an example of creating dot gain matrices in which values are so set as to provide the largest dot gain with the respective matrix sizes. As shown in FIGS. 22A to 22D, the amount of dot gain corresponding to each resolution is obtained for each matrix size.

FIGS. 23A to 23C are diagrams showing an example of creating a matrix having the same amount of dot gain as a smaller matrix. However, no new table is created for a 1×1 table size.

FIG. 24 is a table showing a matrix pattern of the resolution versus the amount of dot gain. The table shown in FIG. 24 was created by obtaining, through experiment, the dot gain percentage of a halftone dot at each resolution for each of the previously created matrices.

FIG. 25 is a diagram showing an example of calculating the amount of dot gain for a resolution not shown in the table. As shown in FIG. 25, two resolutions (454 dpi and 909 dpi) closest to and lying on both sides of the resolution of an input image are selected from the table, and a table for the input image resolution (800 dpi) is calculated by the following equation.

$$C=(800-454)/(909-454) \times (B-A)+A \quad (8)$$

Using the newly created resolution table, the size of a basic table combination that can reproduce the input dot gain percentage is selected, and a new table value is calculated through weighted calculation from the input dot gain percentage.

FIG. 26 is a diagram showing an example of creating, from two matrices expressing different dot gain amounts, a matrix expressing a dot gain amount intermediate between the two. Dot gain percentages (26% and 32%) closest to and lying on both sides of the input dot gain percentage are selected from the table, and a matrix value corresponding to the dot gain percentage (30%) of the input image is calculated by the following equation.

$$C=(30-26)/(32-26) \times (B-A)+A \quad (9)$$

As described above, according to the present invention, since a print proof can be produced using binary data used in actual printing, an output can be produced even when only binary data is available.

The advantageous effects of the present invention achieved by the above embodiments are summarized below.

According to the first embodiment, an output for halftone dot reproduction can be produced with halftone dots used for printing.

According to the second embodiment, a correct color proof that matches the operating conditions of the printing press can be obtained.

According to the third and fourth embodiments, a matrix can be set for each color corresponding to each printing plate.

According to the fourth embodiment, the amount of dot gain as a factor for determining printed color can be adjusted.

According to the fifth embodiment, if a resolution is converted, for example, from 600 dpi to 300 dpi, that is, by a factor of two both vertically and horizontally, changes in color are indiscernible to the human eye because of additive color mixing.

According to the sixth embodiment, color conversion can be performed without taking dot gain into account.

According to the seventh embodiment, the occurrence of moire can be suppressed when producing an enlarged or reduced output.

According to the gray adjustment shown in the eighth embodiment, the appearance of press printed material and the appearance of the print proof can be adjusted.

According to the ninth embodiment, an image formed with a plurality of resolutions to maintain image quality can be processed.

According to the 10th embodiment, delicate sharpness of halftone dots can also be adjusted for reproduction.

According to the 11th embodiment, a fast conversion is possible using a table.

What is claimed is:

1. A color image processing apparatus for producing a print proof, comprising:
    a dot gain processing unit for receiving an input of halftoned binary image data, and for converting said binary image data to multi-value image data corresponding to the amount of dot gain of each color;
    a first color-converting unit for converting said multi-value image data to image data in a device-independent color space;
    a resolution converting unit for changing the resolution of said multi-value image in said device-independent color space to match the resolution of an output device; and
    a second color-converting unit for converting said multi-value image data, converted into said device-independent color space, to image data in a color space associated with said output device.

2. A color image processing apparatus as claimed in claim 1, wherein said dot gain processing unit obtains said multi-value image data using a matrix defined by data of pixels surrounding each pixel in said binary image.

3. A color image processing apparatus as claimed in claim 2, wherein the size of said defined matrix and each row/column value in said matrix are determined by the resolution and the amount of dot gain of said binary image.

4. A color image processing apparatus as claimed in claim 3, wherein the size of said matrix and each row/column value in said matrix are determined by halftone data information.

5. A color image processing apparatus as claimed in claim 3, wherein the size of said matrix and each row/column value in said matrix are set independently for each color.

6. A color image processing apparatus as claimed in claim 3, wherein the size of said defined matrix and each row/column value in said matrix are determined by sharpness.

7. A color image processing apparatus as claimed in claim 2, wherein the size of said matrix and each row/column value in said matrix are determined by halftone data information.

8. A color image processing apparatus as claimed in claim 7, wherein the size of said matrix and each row/column value in said matrix are set independently for each color.

9. A color image processing apparatus as claimed in claim 7, wherein the size of said defined matrix and each row/column value in said matrix are determined by sharpness.

10. A color image processing apparatus as claimed in claim 2, wherein the size of said matrix and each row/column value in said matrix are set independently for each color.

11. A color image processing apparatus as claimed in claim 2, wherein the size of said defined matrix and each row/column value in said matrix are determined by sharpness.

12. A color image processing apparatus as claimed in claim 1, wherein said dot gain processing unit, which receives the input of said halftoned binary image data and converts said binary image data to multi-value image data corresponding to the amount of dot gain of each color, calculates data of each pixel by:
    entering all combinations of binary data of pixels surrounding said pixel;
    storing said combinations in said device-independent color space;
    performing dot gain processing and device-independent conversion processing; and creating a table from the results of said processing.

13. A color image processing apparatus as claimed in claim 1, wherein said device-independent color space is a color space where additive color mixing holds.

14. A color image processing apparatus as claimed in claim 1, wherein said first color-converting unit which converts said multi-value image data into said device-independent color space uses a conversion based on Neugebauer theoretical equation.

15. A color image processing apparatus as claimed in claim 1, wherein after converting said multi-value image data, converted into said device-independent color space, to image data in the color space of said output device, said second color-converting unit converts said image data to binary image data using an error diffusion method and outputs said binary image data onto said output device.

16. A color image processing apparatus as claimed in claim 1, further comprising a gray adjusting unit for making gray adjustments by inputting the color of printing paper and the white color of said output device into said device-independent color space.

17. A color image processing apparatus as claimed in claim 1, further comprising: a resolution adjusting unit for receiving an input of binary image data output at a plurality of resolutions and, after converting said binary image to a multi-value image for each resolution, adjusting the resolution of said multi-value image to the highest of said plurality of resolutions; and a color combining unit for combining said multi-value images on a color-by-color basis.

18. A recording medium readable by a computer and used in a color image processing apparatus for producing a print proof, said recording medium having a program recorded thereon for making said computer implement the functions of:

a dot gain processing unit for receiving an input of halftoned binary image data, and for converting said binary image data to multi-value image data corresponding to the amount of dot gain of each color;

a first color-converting unit for converting said multi-value image data to image data in a device-independent color space;

a resolution converting unit for changing the resolution of said multi-value image in said device-independent color space to match the resolution of an output device; and a second color-converting unit for converting said multi-value image data, converted into said device-independent color space, to image data in a color space associated with said output device.

* * * * *